(12) United States Patent
Stokes et al.

(10) Patent No.: US 7,119,372 B2
(45) Date of Patent: Oct. 10, 2006

(54) FLIP-CHIP LIGHT EMITTING DIODE

(75) Inventors: Edward B. Stokes, Charlotte, NC (US); Mark P. D'Evelyn, Niskayuna, NY (US); Stanton E. Weaver, Northville, NY (US); Peter M. Sandvik, Albany, NY (US); Abasifreke U. Ebong, Clifton Park, NY (US); Xian-an Cao, Clifton Park, NY (US); Steven F. LeBoeuf, Schenectady, NY (US); Nikhil R. Taskar, Scarsdale, NY (US)

(73) Assignee: GELcore, LLC, Valley View, OH (US)

( * ) Notice: Subject to any disclaimer, the term of this patent is extended or adjusted under 35 U.S.C. 154(b) by 0 days.

(21) Appl. No.: 10/693,126

(22) Filed: Oct. 24, 2003

(65) Prior Publication Data

US 2005/0087884 A1    Apr. 28, 2005

(51) Int. Cl.
*H01L 27/15* (2006.01)

(52) U.S. Cl. ............................ 257/79; 257/104; 257/86; 257/94; 257/98; 257/103; 257/13; 257/96; 257/778

(58) Field of Classification Search ................ 257/778, 257/79, 104, 86, 94, 98, 103, 13, 96
See application file for complete search history.

(56) References Cited

U.S. PATENT DOCUMENTS

| | | | |
|---|---|---|---|
| 5,838,707 A | 11/1998 | Ramdani et al. | |
| 5,874,747 A | 2/1999 | Redwing et al. | |
| 5,962,875 A | 10/1999 | Motoki et al. | |
| 6,100,586 A | 8/2000 | Chen et al. | |
| 6,320,206 B1 | 11/2001 | Coman et al. | |
| 6,455,340 B1* | 9/2002 | Chua et al. | 438/31 |
| 6,515,308 B1 | 2/2003 | Kneissl et al. | |
| 6,784,463 B1* | 8/2004 | Camras et al. | 257/99 |
| 6,788,366 B1* | 9/2004 | Sawayama et al. | 349/113 |
| 6,903,379 B1 | 6/2005 | Wang et al. | |
| 2003/0213969 A1 | 11/2003 | Wang et al. | |

\* cited by examiner

*Primary Examiner*—Eddie C. Lee
*Assistant Examiner*—Junghwa Im
(74) *Attorney, Agent, or Firm*—Fay, Sharpe, Fagan, Minnich & McKee, LLP

(57) ABSTRACT

A flip chip light emitting diode die (10, 10', 10") includes a light-transmissive substrate (12, 12', 12") and semiconductor layers (14, 14', 14") that are selectively patterned to define a device mesa (30, 30', 30"). A reflective electrode (34, 34', 34") is disposed on the device mesa (30, 30', 30"). The reflective electrode (34, 34', 34") includes a light-transmissive insulating grid (42, 42', 60, 80) disposed over the device mesa (30, 30', 30"), an ohmic material (44, 44', 44", 62) disposed at openings of the insulating grid (42, 42', 60, 80) and making ohmic contact with the device mesa (30, 30', 30"), and an electrically conductive reflective film (46, 46', 46") disposed over the insulating grid (42, 42', 60, 80) and the ohmic material (44, 44', 44", 62). The electrically conductive reflective film (46, 46', 46") electrically communicates with the ohmic material (44, 44', 44", 62).

19 Claims, 6 Drawing Sheets

FLIP-CHIP LIGHT EMITTING DIODE

BACKGROUND

The present invention relates to the electronics arts. It especially relates to flip-chip group III-nitride light emitting diodes for lighting applications, and will be described with particular reference thereto. However, the invention also finds application in conjunction with other types of flip-chip light emitting diodes, and in other optoelectronic devices.

In the flip-chip mounting configuration, a light emitting diode with a light-transmissive substrate and front-side electrodes is bonded "face down" to a substrate. For example, a gallium nitride-based light emitting diode that includes active gallium nitride-based layers grown on a transparent sapphire or silicon carbide substrate can be flip-chip bonded. The flip-chip mounting configuration has a number of advantages, including improved thermal heat sinking due to a close proximity of the front-side active layers to the heat sinking substrate, and elimination of shadowing losses due to the contacts.

The electrodes of the light emitting diode die perform several functions in the flip-chip arrangement, including providing ohmic contacts to the active layers, efficiently reflecting light to contribute to light extraction, and providing thermal pathways for removing heat from the active layers during device operation. The multitasking of the electrodes presents design problems, as it may be difficult to simultaneously optimize optical, electrical, and thermal properties of the electrodes.

In the past, nickel/aluminum (Ni/Al), nickel/silver (Ni/Ag), and other multilayer metal stack electrodes have been used for flip chip group III-nitride light emitting diodes. These electrodes have certain disadvantages. Reflectivity of the metal/semiconductor interface is variable, and depends upon deposition conditions and subsequent processing such as annealing process operations. Metal electrode reflectivity in finished devices is often lower than desired.

While light emitting diodes typically produce light over a narrow spectral range, approximately corresponding to the bandgap of the active semiconductor layer or layers, the reflectivity of metal electrodes is generally only weakly dependent wavelength within the visible wavelength region. This inability to tune electrode reflectivity can be disadvantageous for certain applications, such as fiber optical communications, that benefit from a highly wavelength-selective light output.

BRIEF SUMMARY

According to one embodiment, a flip chip light emitting diode die includes a light-transmissive substrate and a plurality of semiconductor layers disposed on the light-transmissive substrate. The semiconductor layers include a p-type layer and an n-type layer. The semiconductor layers define a device mesa. A reflective electrode is disposed on the device mesa to energize the device mesa to produce light and to reflect the light produced by the device mesa toward at least one of the light-transmissive substrate and sides of the device mesa. The reflective electrode includes electrical connecting material disposed over at least selected portions of the device mesa and making electrical contact with the device mesa. The reflective electrode has laterally periodic reflectivity modulations.

According to another embodiment, a flip chip light emitting diode die includes a light-transmissive substrate and a plurality of semiconductor layers disposed on the light-transmissive substrate. The semiconductor layers include a p-type layer and an n-type layer. The semiconductor layers define a device mesa. A reflective electrode is disposed on the device mesa to energize the device mesa to produce light and to reflect the light produced by the device mesa toward at least one of the light-transmissive substrate and sides of the device mesa. The reflective electrode includes: a light-transmissive insulating material disposed over the device mesa; an electrical connecting material disposed over the device mesa and making electrical contact with the device mesa, the light-transmissive insulating material and the electrical connecting material being distributed substantially uniformly across the device mesa; and an electrically conductive reflective film disposed over the insulating material and the electrical connecting material. The electrically conductive reflective film electrically communicates with the electrical connecting material. One of the light-transmissive insulating material and the electrical connecting material is formed into a grid disposed over the device mesa, and the other of the light-transmissive insulating material and the electrical connecting material is disposed in openings of the grid.

According to yet another embodiment, a flip chip light emitting diode die includes a light-transmissive substrate and a plurality of semiconductor layers disposed on the light-transmissive substrate. The semiconductor layers include a p-type layer and an n-type layer. The semiconductor layers define a light emitting device. A reflective electrode is disposed on the device mesa to energize the device mesa to produce light and to reflect the light produced by the device mesa toward at least one of the light-transmissive substrate and sides of the device mesa. The reflective electrode includes a light-transmissive surface-passivating material disposed over first lateral area portions of the device mesa, and an electrical connecting material disposed over second lateral area portions of the device mesa. The second lateral area portions are interspersed amongst the first lateral area portions. The electrical connecting material electrically communicates with the light emitting device. The reflective electrode further includes an electrically conductive reflective film disposed over the surface-passivating material and the electrical connecting material. The electrically conductive reflective film electrically communicates with the electrical connecting material.

Numerous advantages and benefits of the present invention will become apparent to those of ordinary skill in the art upon reading and understanding the following detailed description.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention. In these FIGURES, layer thicknesses and lateral dimensions are exaggerated for visual clarity, and are therefore not drawn to scale.

DETAILED DESCRIPTION OF THE PREFERRED EMBODIMENTS

Figure 1:
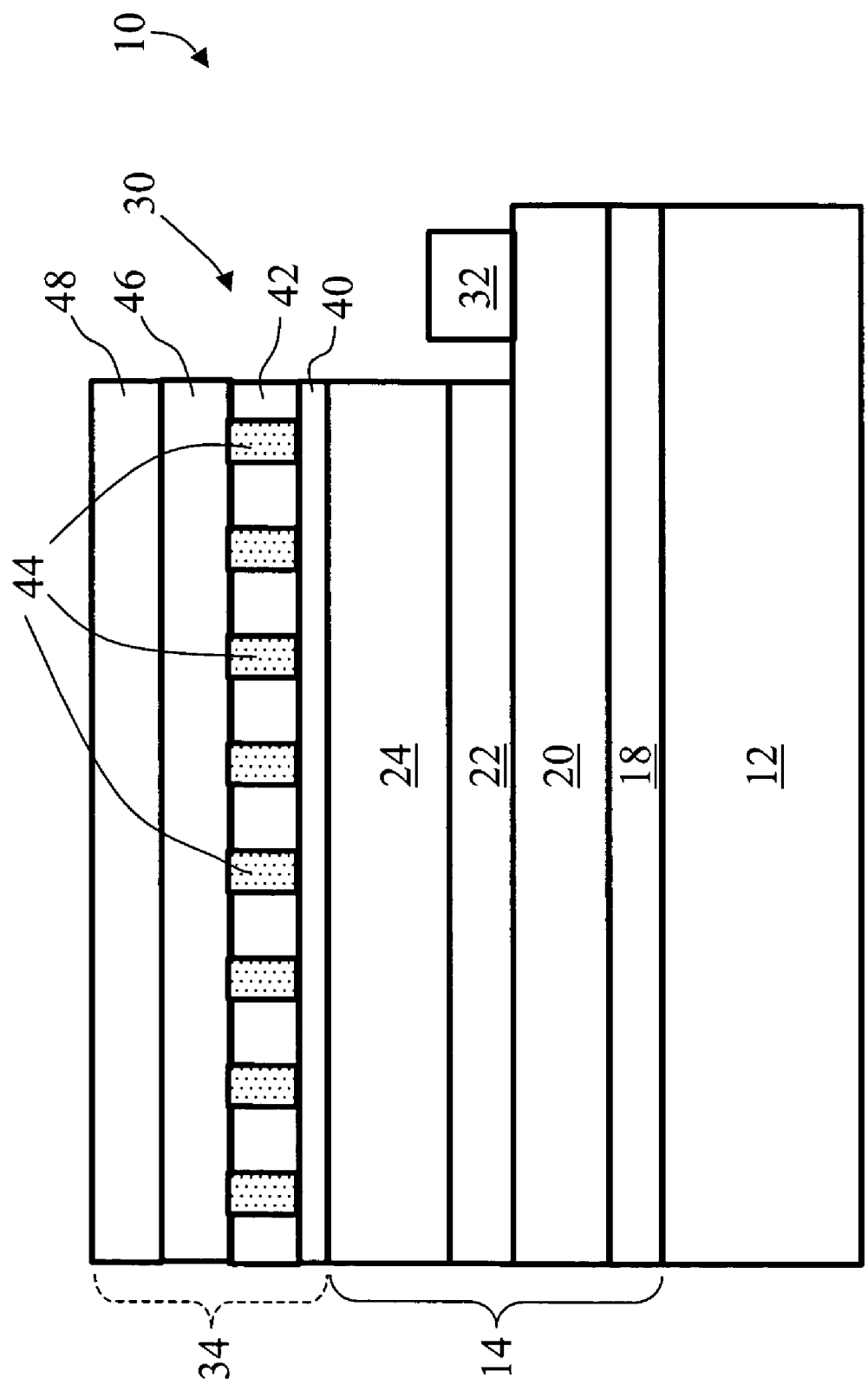
FIG. 1 shows a cross-sectional view of a flip chip group III-nitride light emitting diode with a p-type electrode that includes an insulating grid disposed on a current-spreading thin film.

With reference to FIG. 1, a flip-chip light emitting diode device 10 includes a light-transmissive substrate 12 with a plurality of semiconductor layers 14 deposited thereon. In a preferred embodiment, the substrate is sapphire, ZnO, lithium gallate, AlN, $Al_xIn_yGa_{1-y-x}N$, or silicon carbide (SiC), and the semiconductor layers 14 are selected group III-nitride layers such as GaN layers, AlN layers, InN layers, and ternary and quaternary alloys thereof.

The semiconductor layers 14 are preferably formed on the light-transmissive substrate 12 by metalorganic chemical vapor deposition (also known in the art as organometallic vapor phase epitaxy and similar nomenclatures), molecular beam epitaxy, chemical beam epitaxy, or another epitaxial film deposition technique. However, light emitting diodes of other material systems, such as the group III-phosphides, group III-arsenides, and group IV semiconductors, can also be used. If no suitable light transmissive substrate for epitaxial growth of the selected material system is available, then the device can be formed by transferring the epitaxial layers after deposition from the growth substrate to a host light-transmissive substrate using known methods.

The semiconductor layers 14 define a light emitting structure that emits light when suitably electrically energized. In one specific embodiment, the semiconductor layers 14 include a buffer layer 18 for promoting epitaxial growth, an n-type GaN layer 20, an active region 22, and a p-type GaN layer 24. The active region 22 can include a single layer of InN, GaN, $In_xGa_{1-x}N$ (0<x<1) or the like, or the active region 22 can include a plurality of layers defining, for example, a multiple quantum well or superlattice active region. A group III-nitride-based structure typically emits light in the blue to ultraviolet spectral range, with the specific emission spectrum dependent upon the layer compositions, thicknesses, presence of certain impurities, and other features. Optionally, the semiconductor layers 14 include additional layers, such as cladding $Al_xGa_{1-x}N$ layers (not shown).

Those skilled in the art can readily select semiconductor layer thicknesses, materials, layer sequences, dopants and doping levels, and the like that are adapted for specific light emission applications. For example, group III-phosphide materials and group III-arsenide materials can be configured as light emitting diodes that emit light in the visible to near infrared spectrum.

The semiconductor layers 14 are lithographically processed to remove portions of the active region 22 and the p-type GaN 24 to define a device mesa 30. An n-type electrode 32 is formed on an n-type GaN field surrounding the mesa 30, that is, on a portion of the n-type GaN layer 20 that is exposed by the mesa etching. For example, the n-type electrode 32 can be a titanium/nickel/gold (Ti/Ni/Au) metal stack. A multi-layer reflective p-type electrode 34 is formed on top of the device mesa 30.

The reflective p-type electrode 34 includes a semi-transparent current-spreading layer 40 which in the exemplary group III-nitride light emitting diode die is suitably a nickel oxide (NiO) film, a nickel oxide/gold (NiO/Au) film, a NiO/Ag film, an indium tin oxide (ITO) film, a p-type zinc oxide (ZnO) film, or the like. The current-spreading layer 40 facilitates ohmic or quasi-ohmic contact to the p-type GaN layer 24. To minimize light absorption in the semi-transparent current-spreading layer 40, this layer has a thickness which is preferably less than about 10 nm, with more than 70% light transmission. The material comprising the semi-transparent current-spreading layer 40 can be a light-absorbing material; however, because of its extreme thinness the layer 40 is semi-transparent. Optionally however, the current-spreading layer 40 can have a thickness greater than 10 nm, particularly if it is comprised of a substantially transparent material such as indium tin oxide (ITO).

Figure 2:
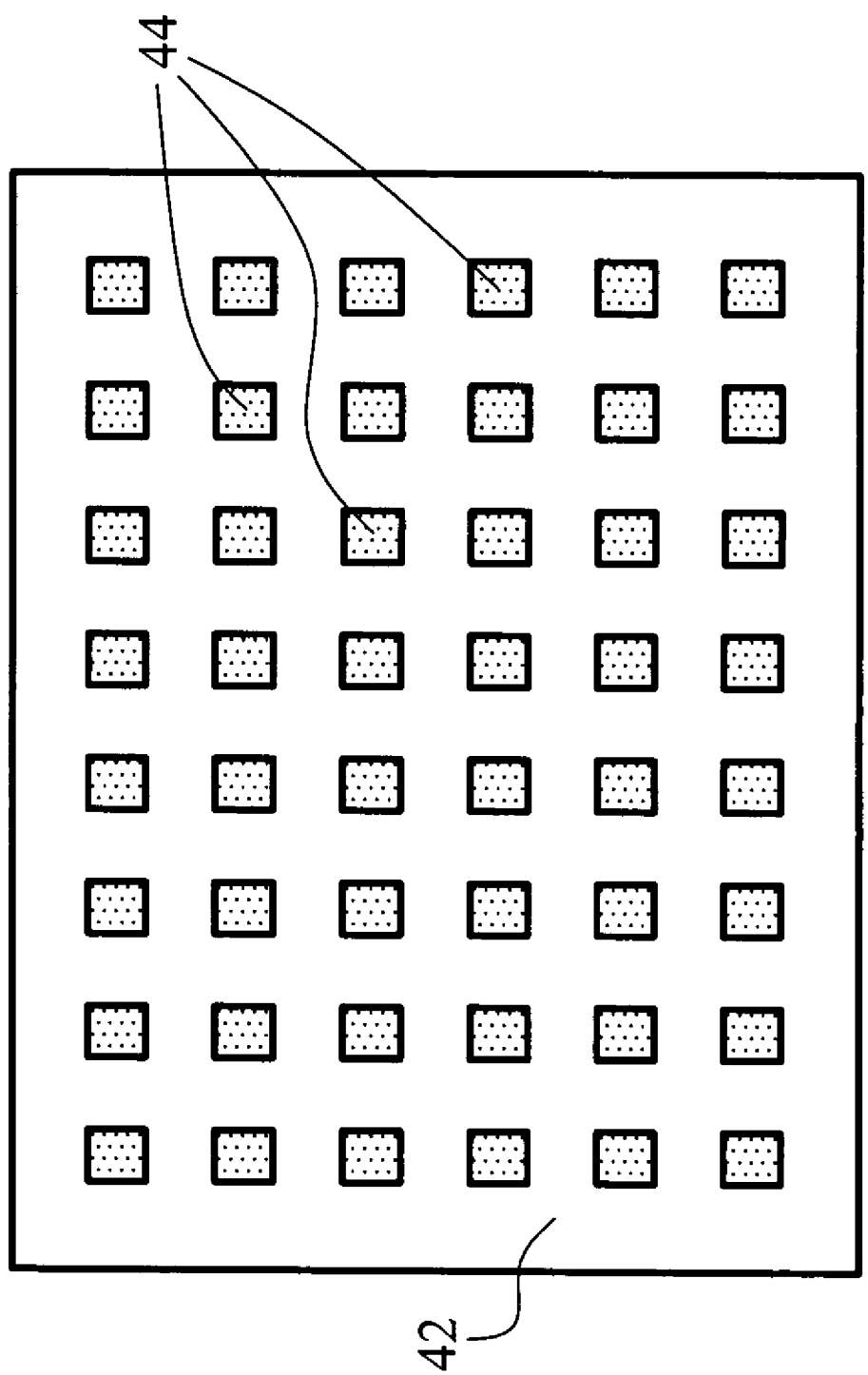
FIG. 2 shows an overhead view of the insulating grid and the electrical connecting material disposed in the grid openings.

With continuing reference to FIG. 1 and with further reference to FIG. 2, a light-transmissive insulating grid 42 is disposed on the semitransparent current-spreading layer 40. The insulating grid 42 is suitably made of a dielectric material. For the exemplary group III-nitride embodiment, the insulating grid 42 is preferably made of a silicon oxide ($SiO_x$) which is most preferably silicon dioxide ($SiO_2$), a silicon nitride ($SiN_x$) which is most preferably $Si_3N_4$, or a silicon oxynitride ($SiO_xN_y$). In the foregoing chemical formulas, x and y correspond to stoichiometric parameters.

The insulating grid 42 includes open areas in which an electrical connecting material 44 is disposed. For the exemplary p-GaN layer 24, the connecting material 44 is suitably nickel oxide (NiO). Optionally, the electrical connecting material 44 includes a metal stack such as titanium-tungsten/gold (Ti—W/Au). The insulating grid 42 occupies first lateral portions of the device mesa 30, while the electrical connecting material 44 occupies second lateral portions of the device mesa 30 which are interspersed amongst the first lateral portions. The second lateral portions preferably correspond to the openings of the insulating grid 42.

In a preferred embodiment, the electrical connecting material 44 is substantially laterally coextensive with the grid openings and does not extend over the insulating grid 42. That is, the first and second lateral portions preferably do not overlap. In this arrangement, the connecting material 44 in each opening is substantially electrically isolated from the connecting material 44 in the other openings. An electrically conductive reflective layer 46 is disposed over the light-transmissive insulating grid 42 and the electrical connecting material 44. The electrically conductive reflective layer 46 electrically interconnects the electrical connecting material 44 in the various grid openings. The electrically conductive reflective layer 46 also cooperates with the light-transmissive insulating grid 42 to define a reflector for reflecting light generated in the semiconductor layers 14 toward the light-transmissive substrate 12 or the sides of the device mesa 30. In a preferred embodiment, the electrically conductive reflective layer 46 is a silver (Ag) layer.

In an alternative embodiment, the roles of the insulating grid and openings containing the electrical connecting material are reversed. That is, in this alternative embodiment the grid comprises electrical connecting material while the openings in the grid contain a light-transmissive insulating material.

Optionally, an electrically conductive diffusion barrier (not shown) such as nickel, rhodium, platinum, palladium, iridium, ruthenium, rhenium, tungsten, molybdenum, niobium, tantalum, or a compound such as $MC_xN_yO_z$ (where M is a metal selected from aluminum, boron, silicon, titanium, vanadium, chromium, yttrium, zirconium, lanthanum, a rare earth metal, halfnium, tantalum, or tungsten, and x, y, and z lie between 0 and 3 inclusive) is disposed between the electrical connecting material 44 and the electrically conductive reflective layer 46. Moreover, if the reflective layer 46 is not suitable for soldering or other bump bonding, a bondable layer 48 is preferably disposed over the reflective layer 46. In a preferred embodiment, the bondable layer 48 is gold.

The light emitting diode die 10 operates as follows. Light is generated in the semiconductor layers 14 of the device mesa 30 responsive to electrical energizing via the electrical connecting material 44 and the n-type electrode 32. The generated light emanates substantially uniformly in all directions. Light that is directed generally toward the light-transmissive substrate 12 passes therethrough to contribute to the light output. Light that is generally directed toward the reflective p-type electrode 34 passes through the semitransparent current-spreading layer 40 and is reflected at the reflector defined by the light-transmissive insulating grid 42 and the reflective layer 46.

In one preferred embodiment, the thickness and refractive index of the insulating grid 42 are selected to define a wavelength-selective interference reflector that is tuned to a characteristic wavelength (for example, a center wavelength) of the generated light. Upon reflection, the light is generally directed toward the light-transmissive substrate 12, and passes therethrough to contribute to the light output. Optionally, the thickness and a refractive index of the semitransparent current-spreading layer 40 can be incorporated into the optical design of the wavelength-selective interference reflector. However, if the semitransparent current-spreading layer 40 is sufficiently thin, its effect on the reflectivity is optionally neglected in designing the interference reflector.

A ratio of an area of the insulating grid 42 to an area of the grid openings (that is, an area of electrical connecting material 44) is selected to provide adequate electrical contacting area while maximizing the reflector area. Increasing the area of the insulating grid 42 relative to the area of the electrical connecting material 44 increases reflectivity of the electrode 34 which increases light collection efficiency. Moreover, because the contact interface generally has a high density of interface defects, reducing the area of contact reduces carrier recombination and can increase efficiency of the light emission process. However, as the contact area decreases the injected current densities increase locally, and electrical resistance of the p-type electrode 34 increases. Those skilled in the art can readily optimize a ratio of an area of the openings to an area of the insulating grid 42 to balance current injection, contact resistance, carrier recombination, and light collection considerations in designing specific embodiments of the p-type electrode 34.

The shape and lateral spacing of the openings of the light-transmissive insulating grid 42 are also suitably designed for specific applications. The grid openings do not have to have the square shape shown in FIG. 2. Rather, the grid openings can be circular, rectangular, hexagonal, or otherwise shaped. Still further, the grid openings do not have to be laterally positioned in the four-fold symmetric periodic fashion shown in FIG. 2. Rather, the grid openings can have different periodicities in orthogonal lateral directions, or can be laterally distributed randomly, pseudorandomly, or aperiodically.

In one embodiment, the grid openings are selectively placed at a periodic spacing to produce laterally periodic reflectivity modulations. The periodicity of the reflectivity modulations is selected to define a light dispersion element, such as a reflection diffraction grating tuned to the characteristic wavelength of the generated light. Such a light dispersion element provides enhanced wavelength selectivity of the reflection, and can also act to direct the light toward sides of the mesa 30.

The p-type electrode 34 is suitably fabricated as follows. After mesa etching to form the device mesa 30, the semitransparent current-spreading layer 40 is deposited on top of the mesa 30. A blanket layer of the dielectric silicon oxide ($SiO_x$), silicon nitride ($SiN_x$), silicon oxynitride ($SiO_xN_y$), or other insulating material forming the insulating grid 42 is next deposited. A lithographic resist is applied and patterned to form windows in the resist corresponding to the openings of the insulating grid 42. The grid openings are dry etched though the resist windows, followed by blanket deposition of the electrical connecting material 44. The resist is then stripped using acetone or another suitable solvent, which effects liftoff of the electrical connecting material from the insulating grid 42, leaving the electrical connecting material 44 in the grid openings. The reflective layer 46 is then deposited, followed by deposition of the bonding layer 48. Those skilled in the art can readily optimize the above process operations, substitute other microelectronic fabrication processes, or otherwise modify the exemplary fabrication process for specific applications.

A significant advantage of the electrode 34 is that the reflective properties of the reflective layer 46 or of the interference reflector defined by the reflective layer 46 and the insulating grid 42 can be optimized independent of the electrical properties of the electrical connecting material 44. Typically, these separate optimizations will result in selecting different materials for the electrical connecting material 44 and the reflective layer 46. For example, a titanium-tungsten/gold (Ti—W/Au) stack may be selected for the electrical connecting material 44, while a titanium/silver (Ti/Ag) stack may be selected for the reflective layer 46. Thus, separate electrical connecting material and reflective layer depositions are employed, as described in the aforementioned exemplary fabrication process.

However, if the same material(s) and layer thickness(es) are used for both the electrical connecting material and the reflective layer, for example, a nickel/silver (Ni/Ag) stack, then the exemplary fabrication process can be modified as follows. After the insulating grid openings are etched, the resist is stripped. The nickel/silver (Ni/Ag) stack is deposited to fill the grid openings and to overcoat the insulating grid 42, thus forming the electrical connecting material and the reflective layer. After the nickel/silver (Ni/Ag) stack deposition, the bondable layer is deposited.

Figure 3:
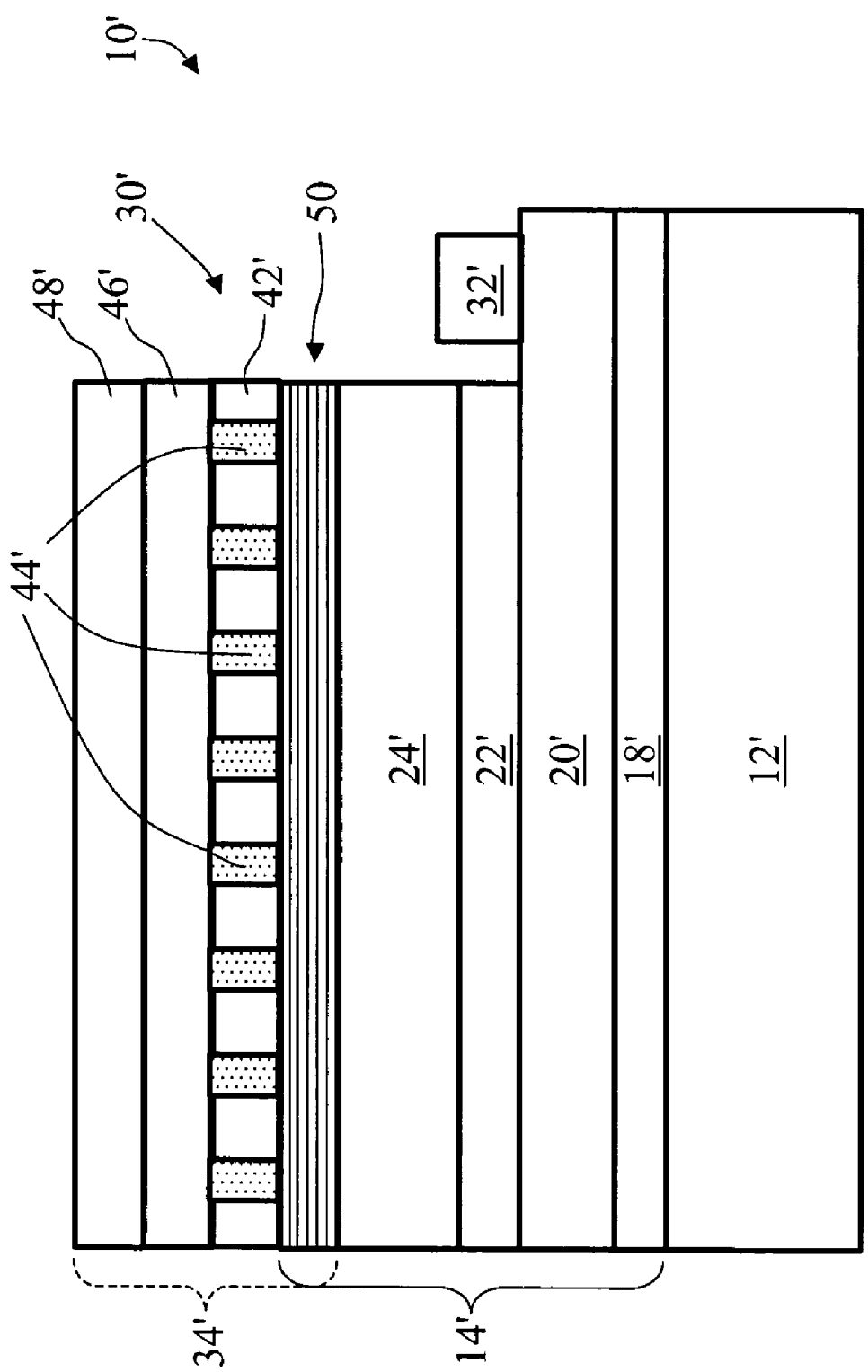
FIG. 3 shows a cross-sectional view of a flip chip group III-nitride light emitting diode with a p-type electrode that includes an insulating grid disposed on a current-spreading short period superlattice.

With reference to FIG. 3, another flip-chip light emitting diode device 10' has a number of components which are substantially similar to corresponding components of the flip-chip light emitting diode device 10. These substantially similar components are designated with primed reference numbers corresponding to the reference numbers of FIG. 1. For example, the flip-chip light emitting diode device 10' has a light-transmissive substrate 12' that substantially corresponds to the substrate 12 of the flip-chip light emitting diode device 10.

The flip-chip light emitting diode device 10' differs from the flip-chip light emitting diode device 10 principally in that the current-spreading layer 40 of the flip-chip light emitting diode device 10 is replaced by a short-period semiconductor superlattice 50. The superlattice 50 is made up of at least two periods, with each period including at least two thin epitaxial semiconductor layers. One suitable embodiment of a group III-nitride flip-chip light emitting diode device 10' has a superlattice period including two or more layers of aluminum indium gallium nitride ($Al_xIn_yGa_{1-x-y}N$) (where x and y designate aluminum (Al)-to-group III and indium (In)-to-group III mole fractions, respectively). The superlattice 50 is suitably grown as part of the metalorganic chemical vapor deposition, molecular beam epitaxy, or other epitaxial growth process used to deposit the semiconductor layers 14', and hence the superlattice 50 is suitably designated as the topmost layers of the plurality of semiconductor layers 14'. By including indium in the superlattice 50, the bandgap of the individual layers is lowered, thus increasing lateral conductivity, that is, thus increasing current flow parallel to the layers.

An epitaxial semiconductor short-period superlattice 50 is shown in FIG. 3. It will be appreciated that instead of a superlattice, the epitaxially grown current-spreading layer can instead include one or a few epitaxially grown semiconductor layers as the topmost layers of the plurality of semiconductor layers. For example, the superlattice 50 could be replaced by a single aluminum indium gallium nitride ($Al_xIn_yGa_{1-x-y}N$) layer. However, the superlattice 50 is preferred because of its beneficial wavelength-selective (Bragg-like) reflector properties, and because of its improved bias toward lateral current transport due to energy barriers at the layer interfaces.

Figure 4:
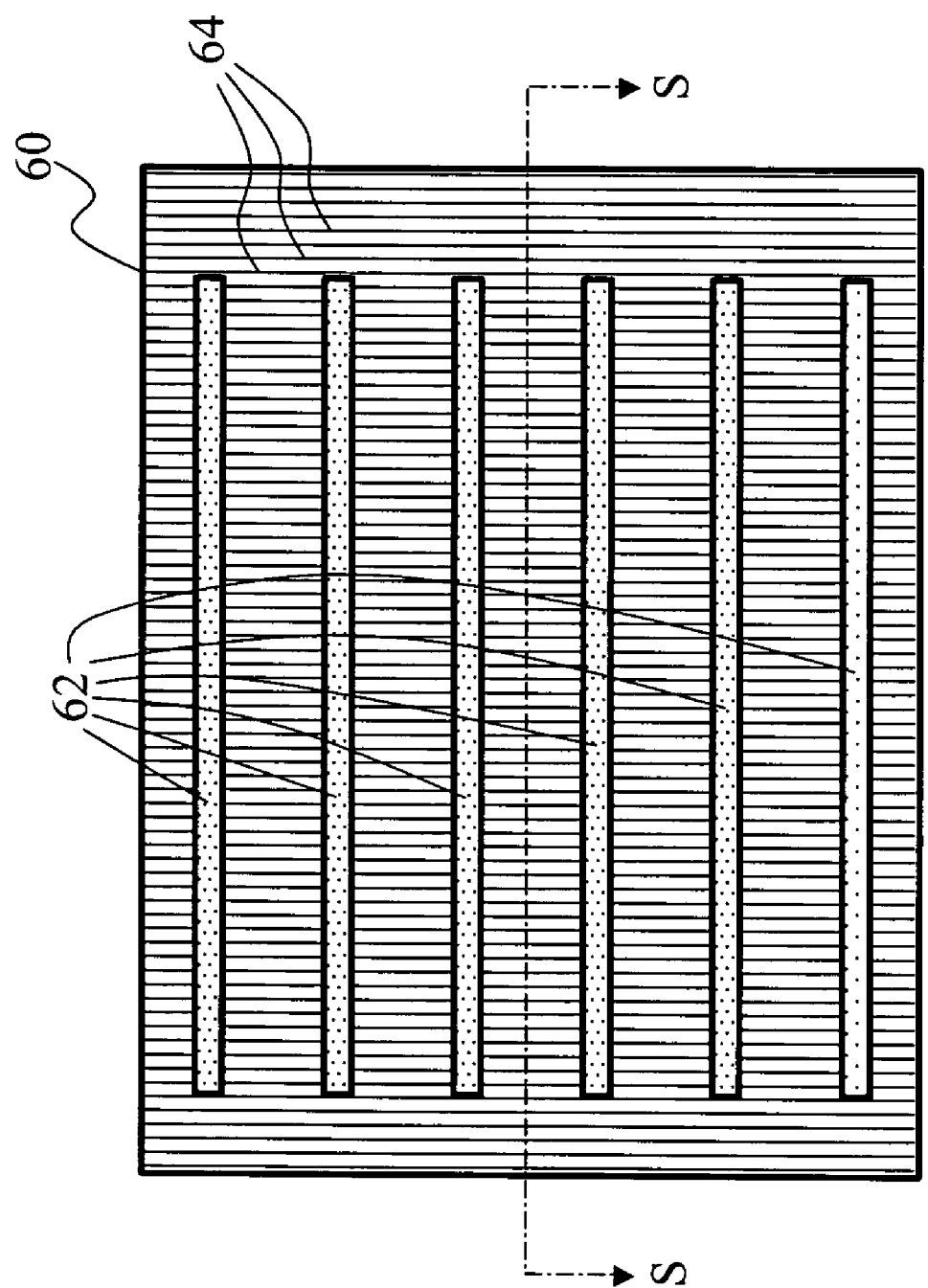
FIG. 4 shows an overhead view of another insulating grid with electrical contact material disposed in the grid openings, in which the grid openings are elongated narrow slots.
Figure 5:
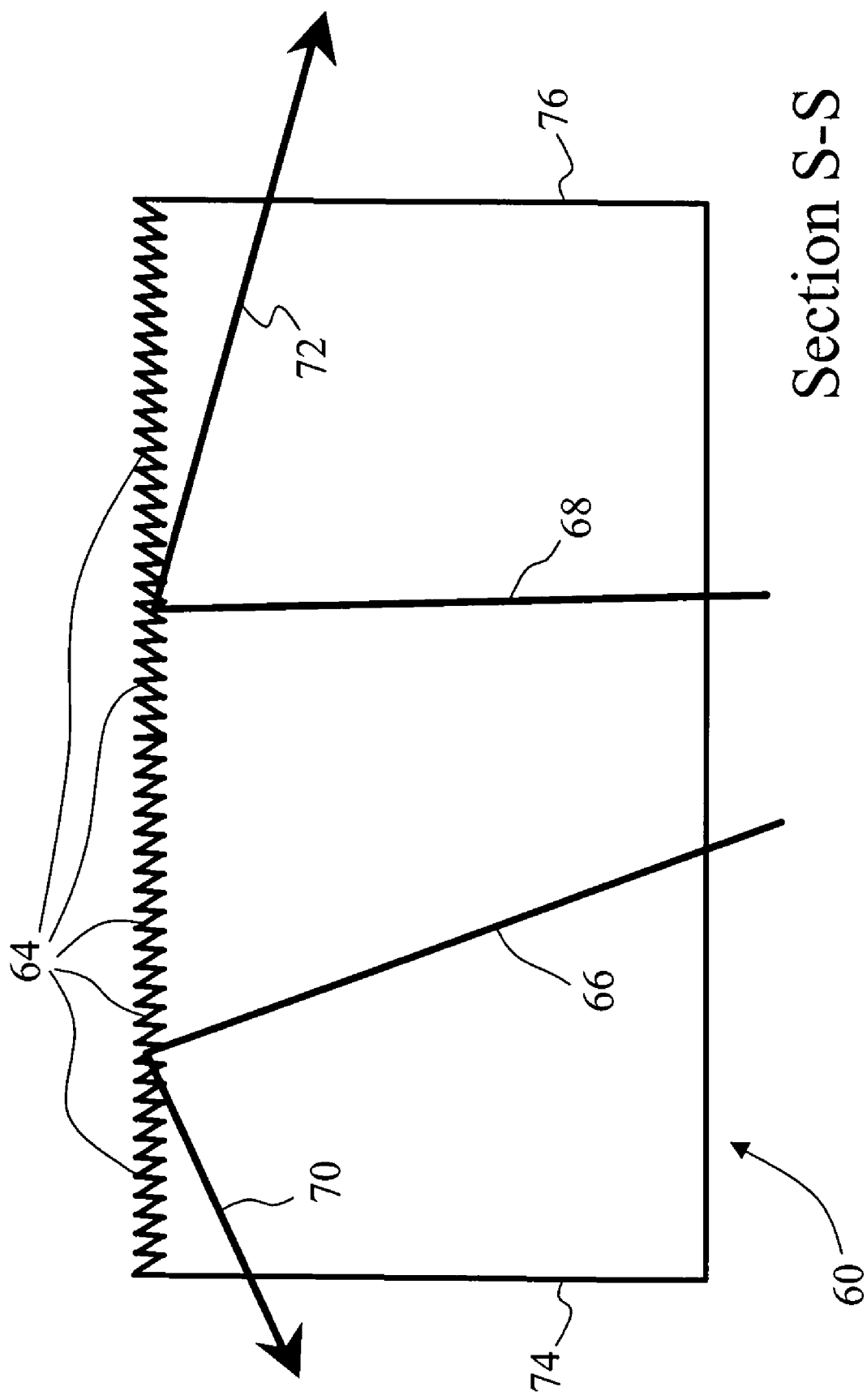
FIG. 5 shows a cross-sectional view of the insulating grid of FIG. 4, taken along section line S—S of FIG. 4, which particularly shows the diffraction grating formed into the upper surface of the insulating grid.

With reference to FIGS. 4 and 5, another substantially light-transmissive insulating grid 60 is described. The insulating grid 60 can, for example, be substituted for the light-transmissive insulating grid 42, 42' of the light emitting diode dice 10, 10' of FIGS. 1 and 3. Unlike the insulating grids 42, 42', the light-transmissive insulating grid 60 has elongated narrow slot openings in which electrical connecting material 62 is disposed. Moreover, the insulating grid 60 includes diffraction grating rulings 64 formed into an upper surface. As seen in FIG. 4, the diffraction grating rulings 64 extend laterally across the upper surface, and are orthogonal to the slot openings of the insulating grid 60. The diffraction grating rulings 64 are metallized by the reflective coating 46, 46' of the light emitting die 10, 10' of FIG. 1 or FIG. 3, respectively.

As seen in FIG. 5, the diffraction grating rulings 64 have a large blaze that efficiently diffracts incident light 66, 68 into large diffraction order reflections 70, 72 that are directed toward sides 74, 76, respectively, of the insulating grid 60. (The incident and reflected light 66, 68, 70, 72 are diagrammatically represented by reflected arrows in FIG. 5.) Hence, light 66, 68 that is generally directed toward the insulating grid 60 passes through the semi-transparent current-spreading layer 40 or superlattice 50 and the insulating grid 60. The light 66, 68 is reflected at the reflection diffraction grating formed by the diffraction grating rulings 64, and passes out the sides 74, 76 of the insulating grid 60 to contribute to the output light.

The insulating grid 60 beneficially provides wavelength-selective reflection tuned to the light generated by the semiconducting layers 14, 14'. Additionally, by reflecting light out sides 74, 76 of the insulating grid 60 rather than reflecting the light back through the semiconductor layers 14, 14' to output through the light-transmissive substrate 12, 12', light absorption in the semiconductor layers 14, 14', and particularly in the p-type layer 24, 24', is avoided.

The diffraction grating rulings 64 can be formed in various ways, for example by lithographic patterning using a mask or optical interferometric exposure, followed by selective etching. The blaze is suitably introduced by using anisotropic or directional dry etching. Alternatively, a mechanical ruling of the surface can be employed.

Diffraction grating rulings can also be incorporated into other insulating grid lateral configurations, such as that of insulating grid 42 shown in FIG. 2. The lateral configuration of the diffraction grating rulings should be selected to diffract light to the edges of the mesa 30, 30' along paths that are free of intervening electrical connecting material 44, 44', 62. Moreover, rather than linear diffraction grating rulings, the diffraction grating can have concentric circular rulings, intersecting orthogonal rulings, or other geometries.

Figure 6:
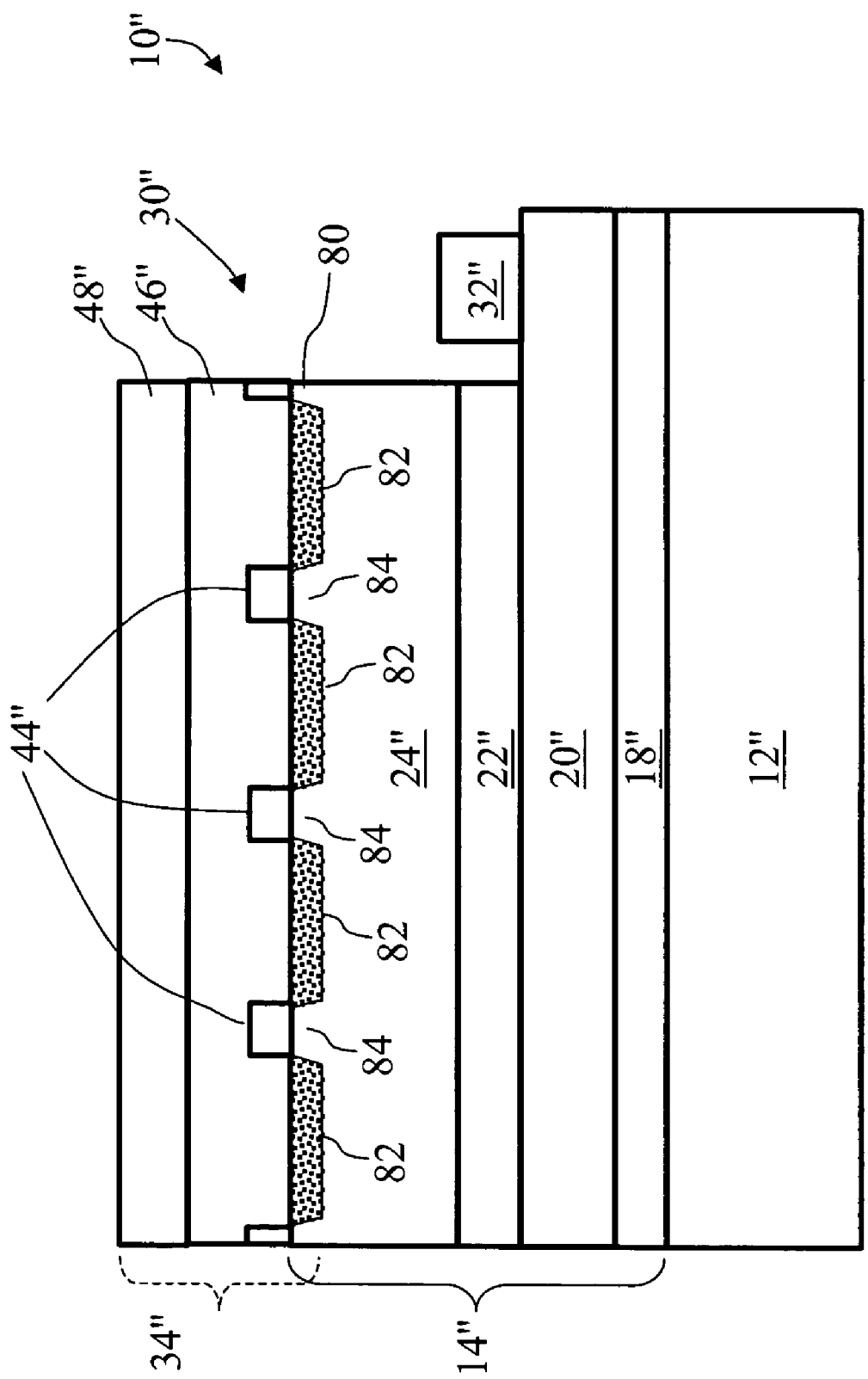
FIG. 6 shows a cross-sectional view of a flip chip group III-nitride light emitting diode with a p-type electrode that includes an insulating grid formed into the topmost semiconductor layer by laterally selective ion implantation.

With reference to FIG. 6, yet another flip-chip light emitting diode device 10" has a number of components that are substantially similar to corresponding components of the flip-chip light emitting diode device 10. These substantially similar components are designated with double-primed reference numbers corresponding to the reference numbers of FIG. 1. For example, the flip-chip light emitting diode device 10" has a light-transmissive substrate 12" that substantially corresponds to the substrate 12 of the flip-chip light emitting diode device 10.

The flip-chip light emitting diode device 10" differs from the flip-chip light emitting diode device 10 principally in that the insulating grid 42 of the flip-chip light emitting diode device 10 is replaced by an insulating grid 80 formed by ion implantation into one or a few upper layers of the plurality of semiconductor layers 14". In the exemplary group III-nitride embodiment, portions of the topmost p-GaN layer 24" are ion implanted to form dead zones 82, with conductive regions 84 of unprocessed p-GaN disposed between the dead zones 82. Suitable ion implantation species include gold (Au) and magnesium (Mg), although other ion species can also be used. The dead zones 82 are insulating compared with the conductive regions 84, due to the ion implantation. Moreover, the ion implantation modifies the refractive index of the dead zones 82 compared with the remainder of the p-GaN. Thus, ion implantation can be used to produce interference reflector characteristics.

Electrical contact material 44" is disposed on the conductive regions 84. For p-GaN, one suitable electrical contact material 44" is a nickel/gold (Ni/Au) stack. However, other materials or stacks can be employed. Reflective layer 46" is disposed over the electrical contact material 44" to interconnect the conductive regions 84. Additionally, the reflective layer 46" cooperates with the dead zones 82 to define the interference reflector. As is known in the art, the thickness and refractive index of the dead zones 82 is readily selected by selecting ion implantation dose, ion implantation energy, and other parameters of the ion implantation process. If the reflective layer 46" is not suitable for soldering or other flip chip bonding, bondable layer 48" is preferably deposited on top of the reflective layer 46".

An advantage of using ion implantation to form the insulating grid is that the ion implantation process can also be used to electrically isolate individual device mesas on a substrate wafer by implanting the n-GaN in the field to form insulating barriers. This facilitates formation of light emitting diode arrays without etching device isolation trenches.

The gridded p-type electrode 34, 34', 34" is disposed on an exemplary device mesa which has p-type topmost layers. In an alternative n-on-p configuration (not shown) in which the device mesa has n-type topmost layers, an n-type electrode including an insulator grid that defines separate reflective and electrical connecting regions can be similarly constructed.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A flip chip light emitting diode die including:
   a light-transmissive substrate;
   a plurality of semiconductor layers disposed on the light-transmissive substrate, the semiconductor layers including a p-type layer and an n-type layer, the semiconductor layers defining a device mesa; and
   a reflective electrode disposed on the device mesa to energize the device mesa to produce light and to reflect the light produced by the device mesa toward at least one of the light-transmissive substrate and sides of the device mesa, the reflective electrode including electrical connecting material disposed over portions of the device mesa and making electrical contact with the device mesa and a light-transmissive dielectric layer laterally interspersed with the electrical connecting material, the reflective electrode having laterally periodic reflectivity modulations.

2. The flip chip light emitting diode die as set forth in claim 1, wherein the periodic reflectivity modulations define a diffraction grating that provides a predetermined diffraction of the light produced by the device mesa.

3. The flip chip light emitting diode die as set forth in claim 1, wherein the electrical connecting material defines isolated regions, and the reflective electrode further includes:
   an electrically conductive reflective layer disposed over the dielectric layer and the electrical connecting material, the reflective layer laterally electrical interconnecting the isolated regions of the electrical connecting material.

4. The flip chip light emitting diode die as set forth in claim 3, wherein the reflective electrode further includes:
   a electrically conductive bondable layer disposed on the electrically conductive reflective layer.

5. The flip chip light emitting diode die as set forth in claim 3, wherein the reflective electrode further includes:
   a current-spreading layer disposed between the device mesa and the dielectric layer.

6. The flip chip light emitting diode die as set forth in claim 5, wherein the current-spreading layer includes:
   a light-transmissive electrically conductive layer.

7. The flip chip light emitting diode die as set forth in claim 6, wherein the light-transmissive electrically conductive layer includes:
   a thin film of a light-absorbing material, the thin film having a thickness of less than about 10 nm and greater than 70% light transmission.

8. The flip chip light emitting diode die as set forth in claim 7, wherein the light-absorbing material is selected from a group consisting of nickel oxide, gold, indium tin oxide, and zinc oxide.

9. The flip chip light emitting diode die as set forth in claim 6, wherein the current-spreading layer includes:
   a topmost one or more of the plurality of semiconductor layers.

10. The flip chip light emitting diode die as set forth in claim 3, wherein the dielectric layer has a thickness selected to define an interference reflector optimized for a characteristic wavelength of the light produced by the device mesa.

11. The flip chip light emitting diode die as set forth in claim 1, wherein the interspersing of the electrical connecting material and the dielectric layer define a reflection diffraction grating optimized for a characteristic wavelength of the light produced by the device mesa.

12. The flip chip light emitting diode die as set forth in claim 1, wherein the dielectric layer is selected from a group consisting of a silicon oxide ($SiO_x$), a silicon nitride ($SiN_x$), and a silicon oxynitride ($SiO_xN_y$), where x and y correspond to stoichiometric parameters.

13. A flip chip light emitting diode die including:
    a light-transmissive substrate;
    a plurality of semiconductor layers disposed on the light-transmissive substrate, the semiconductor layers including a p-type layer and an n-type layer, the semiconductor layers defining a device mesa; and
    a reflective electrode disposed on the device mesa to energize the device mesa to produce light and to reflect the light produced by the device mesa toward at least one of the light-transmissive substrate and sides of the device mesa, the reflective electrode including a topmost one or more of the plurality of semiconductor layers, the topmost one or more of the plurality of semiconductor layers including first insulating portions having a first refractive index, and the topmost one or more of the plurality of semiconductor layers further including second semiconducting portions laterally interspersed amongst the first insulating portions and having a second refractive index different from the first refractive index, the first insulating portions and the second semiconducting portions cooperatively defining the topmost one or more of the plurality of semiconductor layers, the reflective electrode having laterally periodic reflectivity modulations.

14. The flip chip light emitting diode die as set forth in claim 13, wherein the first insulating portions of the topmost one or more of the plurality of semiconductor layers include:
    ion-implanted lateral regions formed of the same material as the second semiconducting portions, wherein the ion-implanted lateral regions are substantially less electrically conductive than the second semiconducting portions.

15. The flip chip light emitting diode die as set forth in claim 1, wherein an interface disposed between the plurality of semiconductor layers and the reflective electrode is roughened to scatter the reflected light toward the sides of the device mesa.

16. The flip chip light emitting diode die as set forth in claim 15, wherein roughening includes a lateral periodicity defining a diffraction grating.

17. A flip chip light emitting diode die including:
    a light-transmissive substrate;
    a plurality of semiconductor layers disposed on the light-transmissive substrate, the semiconductor layers including a p-type layer and an n-type layer, the semiconductor layers defining a device mesa; and
    a reflective electrode disposed on the device mesa to energize the device mesa to produce light and to reflect the light produced by the device mesa, the reflective electrode including electrical connecting material disposed over portions of the device mesa and making electrical contact with the device mesa, an insulating grid having openings at which the electrical connecting material is disposed, and a reflective layer disposed over the insulating grid and the electrical connecting material and electrically interconnecting the electrical connecting material at the openings, a roughened interface being disposed between the reflective layer and the insulating grid to scatter the reflected light toward the sides of the device mesa.

18. A flip chip light emitting diode die including:

a light-transmissive substrate;

a plurality of semiconductor layers disposed on the light-transmissive substrate, the semiconductor layers including a p-type layer and an n-type layer, the semiconductor layers defining a device mesa; and a reflective electrode disposed on the device mesa to energize the device mesa to produce light and to reflect the light produced by the device mesa toward at least one of the light-transmissive substrate and sides of the device mesa, the reflective electrode including electrical connecting material portions disposed over the device mesa and making electrical contact with the device mesa and light-transmissive dielectric portions disposed over the device mesa and laterally interspersed with the electrical connecting material portions.

19. The flip chip light emitting diode die as set forth in claim 18, wherein the electrical connecting material portions are isolated from one another, and the reflective electrode further includes:

an electrically conductive reflective layer disposed over the connecting material portions and the dielectric portions, the reflective layer laterally electrical interconnecting the isolated electrical connecting material portions.

* * * * *